United States Patent [19]

Fukushima et al.

[11] Patent Number: 4,868,979

[45] Date of Patent: Sep. 26, 1989

[54] METHOD OF AND APPARATUS FOR MOUNTING CHIPS

[75] Inventors: Hiroshi Fukushima; Kikuji Fukai, both of Tokyo, Japan

[73] Assignee: Taiyo Yuden Co., Ltd., Tokyo, Japan

[21] Appl. No.: 294,759

[22] Filed: Jan. 6, 1989

[30] Foreign Application Priority Data

May 24, 1988 [JP] Japan ................................. 63-126328

[51] Int. Cl.4 .......................... H05K 3/34; B23P 19/00
[52] U.S. Cl. ....................................... 29/840; 29/740; 228/179
[58] Field of Search ................. 29/840, 740, 834, 741; 228/179

[56] References Cited

U.S. PATENT DOCUMENTS

| | | | |
|---|---|---|---|
| 3,859,723 | 1/1975 | Hamer et al. | 29/840 |
| 4,127,432 | 11/1978 | Kuwano et al. | 29/740 X |
| 4,342,090 | 7/1982 | Caccoma et al. | 29/834 X |
| 4,345,371 | 8/1982 | Ohsawa et al. | 29/840 X |
| 4,375,126 | 3/1983 | Düll et al. | 29/740 |
| 4,381,601 | 5/1983 | Tamai et al. | 29/834 X |
| 4,386,464 | 6/1983 | Yanai et al. | 29/740 X |
| 4,451,324 | 5/1984 | Ichikawa et al. | 29/740 X |
| 4,459,743 | 7/1984 | Watanabe et al. | 29/840 X |
| 4,748,740 | 6/1988 | Buck et al. | 29/740 |

Primary Examiner—Timothy V. Eley
Assistant Examiner—Carl J. Arbes
Attorney, Agent, or Firm—Flynn, Thiel, Boutell & Tanis

[57] ABSTRACT

A method of mounting chips on a circuit board having a plurality of divided regions provided thereon comprising the steps of: forcibly delivering chips housed bulky in a housing container composed of a plurality of containers by delivering means to housing recesses provided on a template in positions corresponding to positions where the chips are mounted on the circuit board; moving a chip transfer means over the circuit board, the transferring means provided for transferring the chips housed in the housing recesses to the circuit board while the chips are held in same positions as they are delivered by the guide means; loading the circuit board on a base; and shifting the circuit board successively along multiple divided regions provided on the circuit board to the position of the housing recesses by means of a chip shifting means so that the chips can be mounted on the multiple divided regions. The apparatus for carrying out the method is disclosed.

5 Claims, 7 Drawing Sheets

METHOD OF AND APPARATUS FOR MOUNTING CHIPS

BACKGROUND OF THE INVENTION

1. Field of the Invention

The present invention relates to a method of and apparatus for mounting chip shaped electronic parts (hereafter referred to as chips) housed bulky in a housing container.

2. Description of the Prior Art

Figure 11:
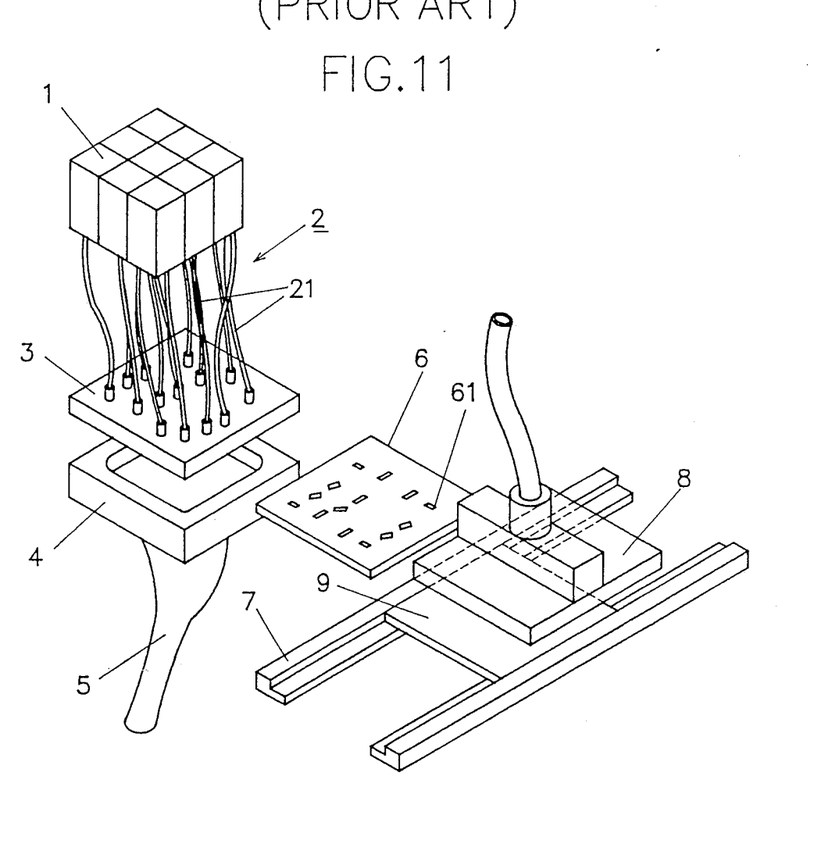
FIG. 11 is a perspective view of a prior apparatus for mounting chips.

In a prior method of mounting the chips on a circuit board in a predetermined position thereof is carried out by employment of an apparatus as illustrated in FIG. 11. The chips housed bulkly in a container 1 composed of a plurality of containers are taken out one by one through a plurality of tubular chutes 21, and delivered to housing recesses 61 of a template 6 and housed therein. The housing recesses 61 are respectively positioned correspondingly to positions where the chips are mounted on the circuit board 9. The chips are transferred from the housing recesses 61 to the circuit board 9 and mounted thereon by chip transferring means 8 such as suction unit and the like while they are housed in the housing recesses 61 and kept positioned at the housing recesses 61. The cip transferring means 8 travels on a guide means, namely, a conveyor 7. In such moving operations of each element, the chips are mounted on the circuit board 9 in the predetermined position.

The adhesives previously applied to the mounting regions of the circuit board 9 temporarily fix the chips by adhering them transferred from the suction unit 82 to the circuit board 9. The chips are, while they are adhered on the circuit board 9, subjected to the soldering.

With a progress of miniaturization of the chips and high density of the circuit board 9, many chips are likely to be mounted on the circuit board 9. In addition to such progress, employed the method is that one printed circuit board 9 are divided into many sections on which the same kind of patterns are arranged and the chips are mounted on the arrangement of the patterns, thereafter the circuit board 9 is divided in each region where the chips are mounted, so-called circuit board 9 having multiple divided regions is employed. Such employment can realize reduction of printing the circuit and labors and time involved in mounting the chips as well as reduction of the mounting process.

There are conventionally adopted in the prior method that the chips are mounted as a lump on the circuit board 9 having multiple divided regions. However, there arises a problem that a large number of containers and a large size of guide means having many chutes are required which causes the apparatus to be large sized.

SUMMARY OF THE INVENTION

It is a first object of the present invention to provide a method of mounting chips on a circuit board having multiple divided regions with use of small number of chip containers and a small sized delivering means.

It is a second object of the present invention to apply the method of mounting chips on a circuit borad having different kind of division patterns provided thereon by varying travelling pitch with use of division shifting means for shifting the circuit board.

It is a third object of the present invention to provide an apparatus to carry out the methods in the first and second objects of the present invention.

To achieve the above objects, the present invention provides a method of mounting chips on a circuit board having multiple divided regions provided thereon comprising the steps of: forcibly delivering chips housed bulky in a housing container composed of a plurality of containers by delivering means to housing recesses provided on a template in positions corresponding to positions where the chips are mounted on the printed circuit board; moving a transferring means over the circuit board, the transferring means provided for transferring the chips housed in the housing recesses to the circuit board while the chips are held in same positions as they are delivered by the delivering means; loading the circuit board on a base; and shifting separately the multiple divided regions provided on the circuit board to the position of the housing receses by means of shifting means so that the chips can be mounted on each multiple divided region.

The above and other objects, features and advantages of the present invention will become more apparent from the following description taken in conjunction with the accompanying drawings.

PREFERRED EMBODIMENT OF THE INVENTION

First Embodiment (FIGS. 1 through 8)

Figure 1:
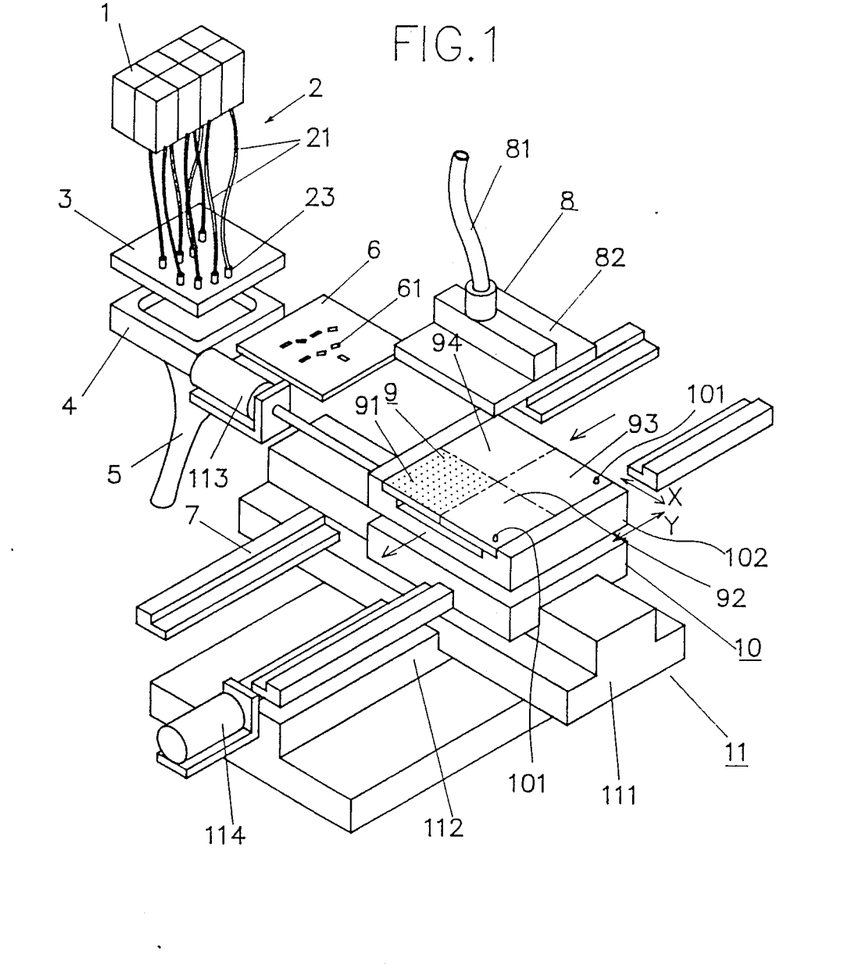
FIG. 1 is a perspective view of an apparatus for mounting chips, according to a first embodiment of the present ivnention.

An apparatus for mounting chips will be described with reference to FIGS. 1.

A housing means or a housing container 1 composed of a plurality of the containers houses therein chips in bulk. A delivering means composed of a plurality of chutes 21 corresponding to the number of a plurality of the housing container 1 each connected to the housing container 1 at the end thereof and to a pattern base 3 at the other end thereof via couplings 23 implanted respectively in the pattern base 3. Under the pattern base 13 there is provided a vacuum means composed of a vaccum case 14 connected to a suction duct 15. Inserted under the base 3 is a template 6 having housing recesses 61 positioned in corresponding relation to locations of a printed circuit where chips are mounted. The couplings 23 are respectively positioned correspondingly to locations of the housing recesses 61 in the template 6. When the template 6 is inserted under the pattern base 3, the other ends of the chutes 21 connected to the couplings 23 are further connected to the housing recesses 61 of the template 6 to form flows of air from the housing container 1 to the suction duct 5 through the chutes 21 and the housing recesses 61. With such an arrangement, the chips housed in the housing container 1 are forcibly delivered to the housing recesses 61 through the chutes 21 in which the chips are directed respectively in predetermined directions.

The chips housed in the housing recesses 61 of the template 6 are transferred to a circuit board 19 via a chip transfer means 8. The chip transfer means 8 comprises usually a suction unit 82, a duct 81 mounted on the suction unit 82 and connected to the housing recesses 61 at one end thereof and to a suction pump (not shown) at the other end thereof for forcibly drawing the chips housed in the housing recesses 61 by the vacuum means and holding the chips in the suction unit 82. The suction unit 82 reciprocally moves between the location over the template 6 which is retracted from the pattern base 3 and the circuit board 9 which is guided by a printed circuit board holding means such as conveyor 7 and held by the circuit board holding means 10. The circuit board holding means 10 has, for example, a positioning pin 101 for holding the circuit board 9 at the predetermined position.

The circuit board holding means 10 has further a divided region shifting means 11 fixed thereunder for moving the circuit board 9 held by the circuit board holding means 10 both in X direction and Y direction respectively shown in arrows. The divided region shifting means 11 as shown in FIG. 1 comprises a first table 111 for holding a base 102 loading thereon the circuit board 9 and slidable in the X direction, a second table 112 for holding thereon the first table 111 and slidable in the Y direction, and driving means 113, 114 for driving the base 102, the first table 111 respectively along the first and the second tables 111, 112. The driving means 113, 114 are driven by an electric motor, an actuator and the like.

The method of mounting the chips with use of the apparatus having an arrangement as set forth above will be generally described.

Firstly, upon insertion of the template 6 under the pattern base 3, the chips housed in the housing container 1 are delivered to the housing recesses 61 of the template 6 by the chutes 21 while the template 6 is still inserted. Secondly, the template 6 is withdrawn from the under portion of the pattern base 3 and the suction unit 82 is loaded on the withdrawn template 6 so that the chips are pulled out at the same state as they are arranged in the recesses 61, and kept on the suction unit 82. Thirdly, the chip transfer means 8, namely, suction unit 82 is moved over the circuit board 9 held on the circuit board holding means 10 to thereby transfer and mount chips kept thereon to a first divided region 91 of the circuit board 9. A series of operations from first to third steps will be successively repeated while the circuit board 9 is shifted by divided region shifting means 11 in the directions of X and Y, whereby the chips are successively mounted on second, third and fourth divisions of the circuit board 9.

FIGS. 2 through 8 are views of assistance in explaining operations of the circuit borrd 9 carried out by the divided region shifting means 11 wherein the chips are respectively mounted on divided region of the circuit board by dividing half the circuit board vertically and laterally, so-called the circuit board having four divided regions.

Figures 2, 3:
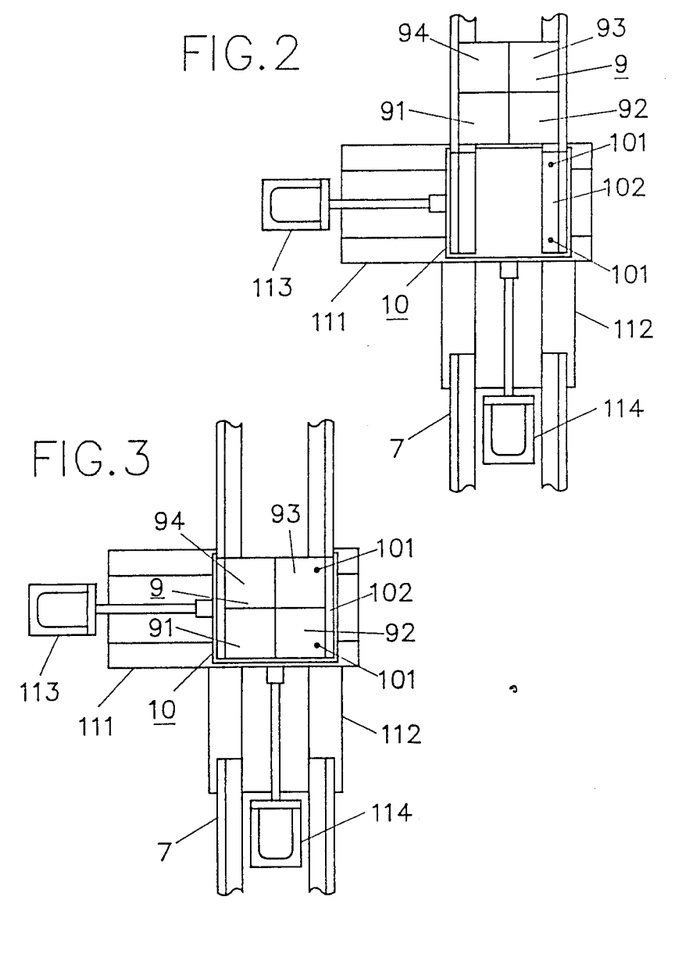
FIGS. 2 through 8 are views of assistance in explaining a method for mounting chips according to a first embodiment of the present invention.
Figure 4:
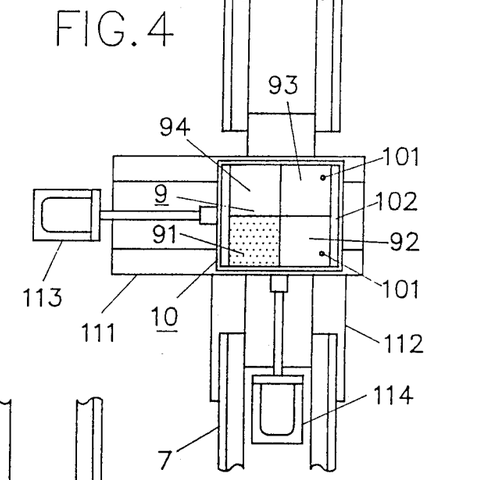
Figure 5:
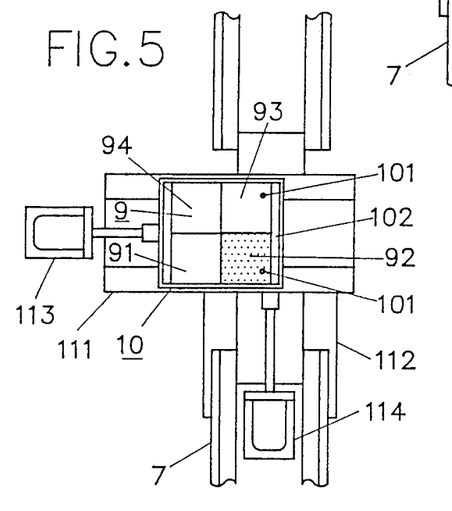
Figures 6, 7, 8:
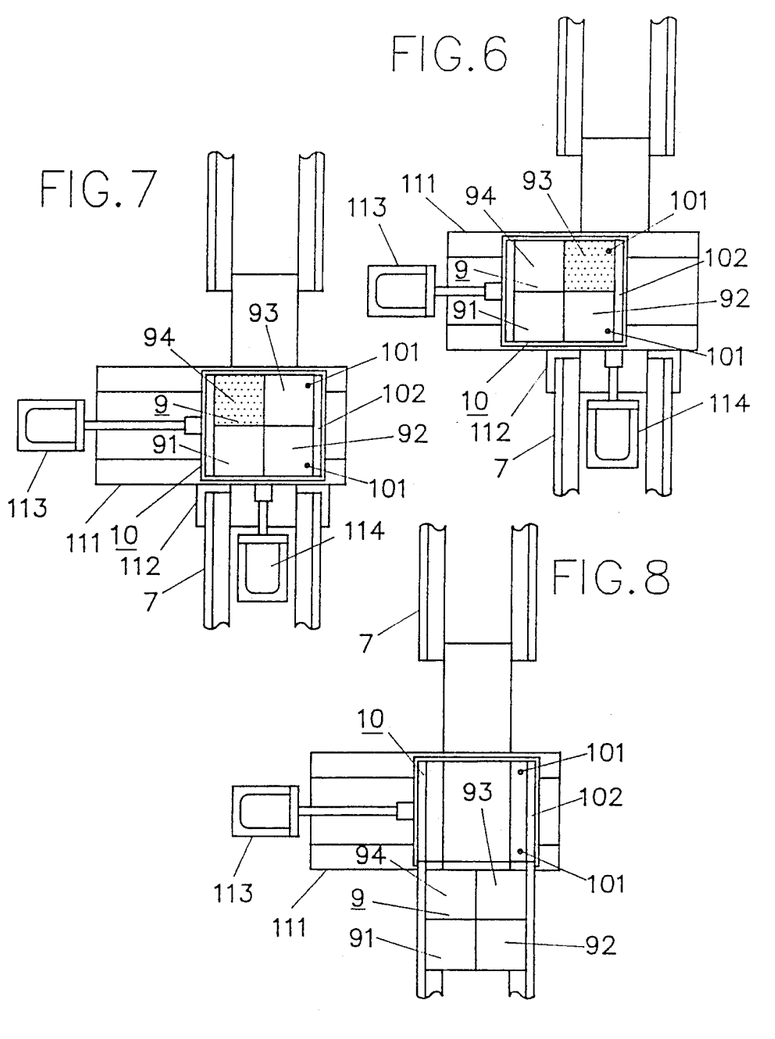

The circuit board 9 guided from a workstation, namely, from a front side in FIG. 2 by means of the guide means 7 as shown in FIG. 2 is loaded on the base 102 as shown in FIG. 3 and fixed to a predetermined position relative to the positioning pin 101. Then, the first divided region 91 of the circuit board 9 is shifted to a mounting area dotted in FIG. 4 on which the chips are transferred through the suction unit 82 of the chip transfer means 8 and mounted. Thereafter, the second division 92 is shifted to the mounting region dotted in FIG. 5 on which the chips are delivered from the suction unit 82 of the chip transfer means 8 and mounted. Successively, the third and the fourth divided regions 93, 94 are shifted to the mounting regions dotted in FIGS. 6, 7 on which the chips are transferred from the suction unit 82 of the chip transfer means 8 and mounted. After the chips are mounted on the first through the fourth mounting regions of the circuit board 9, the circuit board 9 mounting the chips thereon is guided to a next workstation by the guide means 7. Thereafter, the chips mounted on the respective regions are subjected to soldering on the circuit board 9.

The adhesives previously applied to the mounting regions of the circuit board 9 temporarily fix the chips by adhering them transferred from the suction unit 82 to the circuit board 9. The chips are, while they are adhered on the circuit board 9, subjected to the soldering.

Figure 9:
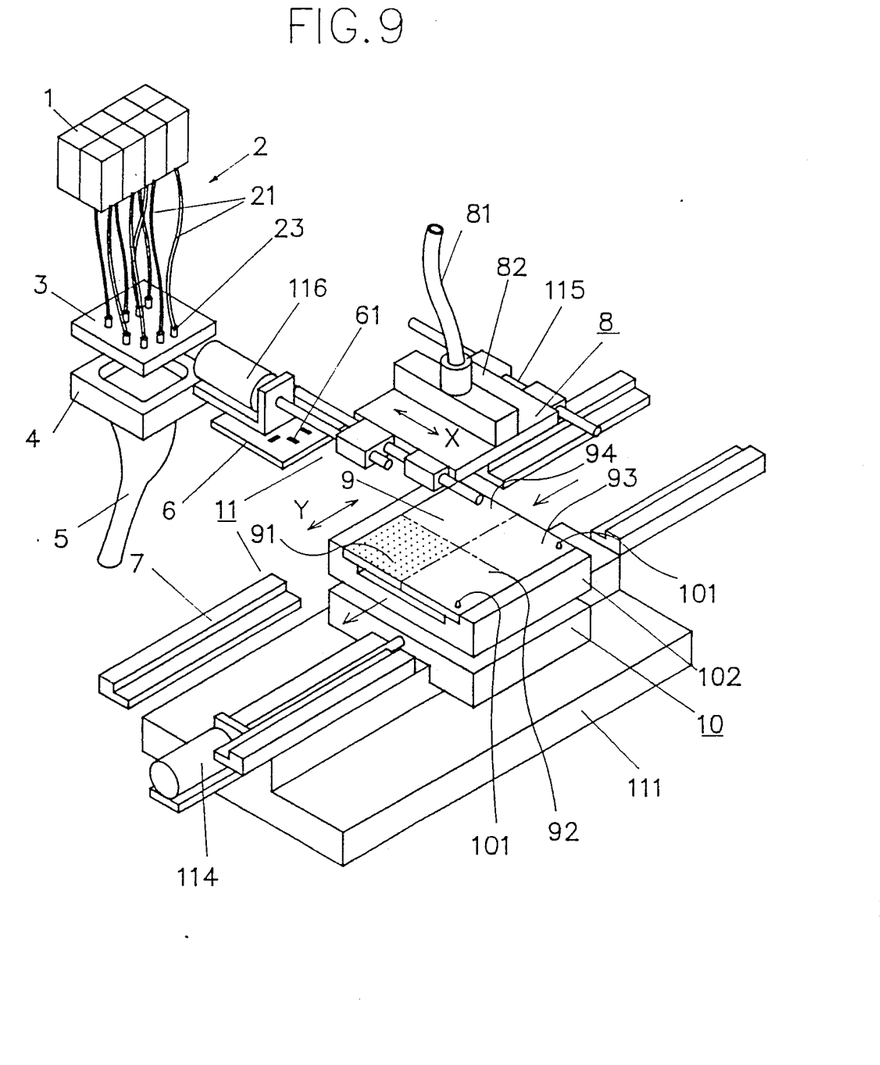
FIG. 9 is a perspective view of an apparatus for mounting chips, according to a second embodiment of the present ivnention.

Second Embodiment (FIG. 9)

A method of and an apparatus for mounting chips, according to a second embodiment of the present invention, will be described with reference to FIG. 9.

The base 102 of the circuit board holdimg means 10 for holding the circuit board 9 is held by and slidable on the table 112 in the Y direction while the table 112 is driven by the driving mechanism 114. The suction unit 82 is held by and is slidable on a guide 115 in the X direction relative to the circuit board 9, and is driven by a driving mechanism 116. With such an arrangement of the apparatus according to the second embodiment of the present invention, the circuit board 9 is shifted only in the direction Y when the chips are mounted thereon while the suction unit 82 is shifted in the X direction. That is, the chips are mounted on the circuit board 9 while the suction unit 82 and the circuit board 9 are relatively shifted in the X and Y directions.

As mentioned above, the chip transfer means 8 may be arranged to be shifted relative to the circuit board 9 while the guide mechanism may be disposed at the chip transfer means 8 or the circuit board 9.

Figure 10:
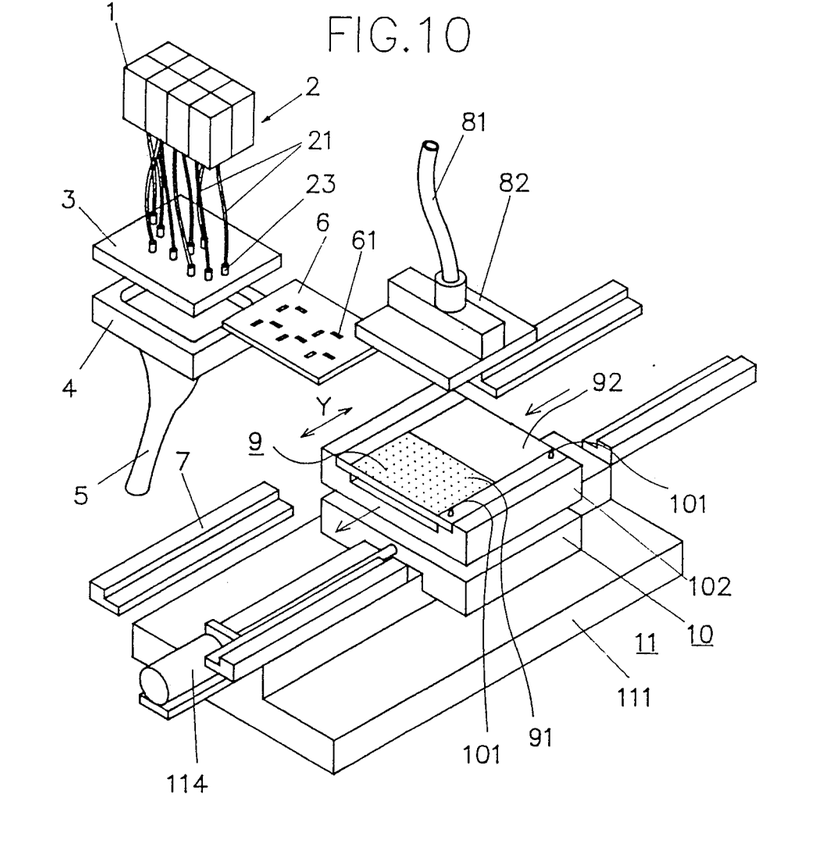
FIG. 10 is a perspective view of an apparatus for mounting chips, according to a third embodiment of the present invention.

Third Embodiment (FIG. 10)

An apparatus for mounting chips, according to a third embodiment of the present invention, will be described with reference to FIG. 10.

Provided tht the divided region on the circuit board 9 is aligned in series, the divided region shifting means 11, as shown in FIG. 10, comprises only one table 111 for holding a base 102 loading thereon the table 111 and slidable in one direction, namely, only in X direction or Y direction.

The driving means for driving the circuit board 9 or the chip transfer means 8 can cope with a variety of patterns of the circuit board 9 in such a manner that the travelling pitch can be freely set depending on intervals between the divided regions provided on the circuit board 9 if the driving means are controlled by a computer with use of a stepping motor.

Although the invention has been described in its preferred form with a certain degree of particularity, it is to be understood that many variations and changes are possible in the invention without departing from the scope thereof.

What is claimed is:

1. A method of mounting chips on a circuit board having a plurality of divided regions provided thereon comprising the steps of:
   (a) forcibly delivering chips housed bulky in a housing container composed of a plurality of containers by delivering means to housing recesses provided on a template in positions corresponding to positions where the chips are mounted on the circuit board;
   (b) moving a chip transfer means over the circuit board, the chip transfer means provided for transferring the chips housed in the housing recesses to the circuit board while the chips are held in the same positions as they are delivered by the delivering means;
   (c) loading the circuit board on a circuit board holding means; and
   (d) shifting the circuit board successively along multiple divided regions provided on the circuit board to the position of the housing recesses by means of a chip shifting means so that the chips can be mounted on the multiple divided regions.

2. An apparatus for mounting chips on a printed circuit having multiple divided regions provided thereon comprising:
   a housing means composed of a plurality of containers housing therein chips in bulk;
   a delivering means composed of a plurality of chutes, each delivering means being connected to the housing means at the end thereof;
   a pattern base having couplings implanted therein, each coupling being connected to the other end of each delivering means;
   a template being insertable under the pattern base and having housing recesses for temporarily housing chips delivered from the delivering means;
   a vacuum means provided under the pattern base for drawing the chips housed in the housing container to the housing recesses when the template is inserted under the pattern base;
   a chip transfer means composed of a suction pipe connectable to the vacuum means and a suction unit which is movable between the template and the circuit board for transferring the chips from the housing recesses to the circuit board;
   a circuit board holding means for holding the board on a base thereof and including a divided region shifting means for shifting multiple divided regions provided on the circuit board to the position of the housing recesses for successively mounting the chips transferred by the transfer means on the multiple divided regions of the circuit board.

3. An apparatus for mounting chips on a circuit board according to claim 2, wherein the divided region shifting means comprises a first table for holding the base of the circuit board holding means slidable thereon in the X direction, a second table for holding thereon the first table slidable in the Y direction, and driving means for driving the base and the first table respectively along the first and the second tables.

4. An apparatus for mounting chips on a circuit board according to claim 2, wherein the divided region shifting means comprises only one table for holding the base of the circuit board holding means slidable thereon in Y direction while the chip transfer means movable in X direction.

5. An apparatus for mounting chips on a circuit board according to claim 2, wherein the divided region shifting means comprises only one table for holding the base of the circuit board holding means slidable thereon in one direction.

* * * * *